United States Patent
Sawert et al.

(10) Patent No.: US 6,681,628 B2
(45) Date of Patent: Jan. 27, 2004

(54) CERAMIC RESISTOR CARD ASSEMBLY FOR FUEL SENSOR

(75) Inventors: Ulf Sawert, Grand Blanc, MI (US); Hugh Wesley Ireland, Clio, MI (US); Wayne Frederick Harris, Grand Blanc, MI (US)

(73) Assignee: Delphi Technologies, Inc., Troy, MI (US)

( * ) Notice: Subject to any disclaimer, the term of this patent is extended or adjusted under 35 U.S.C. 154(b) by 50 days.

(21) Appl. No.: 09/970,393

(22) Filed: Oct. 3, 2001

(65) Prior Publication Data
US 2002/0040597 A1 Apr. 11, 2002

Related U.S. Application Data
(60) Provisional application No. 60/238,881, filed on Oct. 6, 2000.

(51) Int. Cl.[7] ............................................... G01F 23/32
(52) U.S. Cl. ..................... 73/317; 73/290 R; 73/305; 73/314
(58) Field of Search ........................ 73/290 R, 305, 73/307, 317, 314

(56) References Cited

U.S. PATENT DOCUMENTS

| | | | | |
|---|---|---|---|---|
| 4,318,075 A | * | 3/1982 | Pudelko et al. | 338/162 |
| 5,746,088 A | * | 5/1998 | Sawert et al. | 73/317 |
| 6,021,668 A | * | 2/2000 | Sawert et al. | 73/313 |

FOREIGN PATENT DOCUMENTS

DE 299 12 523 12/1999

\* cited by examiner

*Primary Examiner*—Hezron Williams
*Assistant Examiner*—Rodney Frank
(74) *Attorney, Agent, or Firm*—Jimmy L. Funke

(57) ABSTRACT

A ceramic resistor card assembly for a fuel sensor includes a card portion made of a ceramic material. The ceramic resistor card assembly also includes a first conductive ink disposed on the card portion to form a fuel level portion. The ceramic resistor card assembly further includes a second conductive ink disposed on the card portion to form at least one contact for the fuel level portion. The first conductive ink is void of Silver and the second conductive ink contains Silver.

19 Claims, 4 Drawing Sheets

CERAMIC RESISTOR CARD ASSEMBLY FOR FUEL SENSOR

CROSS-REFERENCE TO RELATED APPLICATION(S)

The present invention claims the priority date of copending U.S. Provisional Patent Application Serial No. 60/238,881, filed Oct. 6, 2000.

TECHNICAL FIELD

The present invention relates generally to fuel sensors for vehicles and, more particularly, to a ceramic resistor card assembly for a fuel sensor of a vehicle.

BACKGROUND OF THE INVENTION

It is known to provide a fuel sensor in a fuel tank of a vehicle to sense or indicate a level of fuel in the fuel tank. Typically, the fuel sensor includes a ceramic resistor card operatively connected to structure for a fuel module and a wiper assembly pivotally connected to the structure for engaging the resistor card. The wiper assembly has one end connected to a float to rotate the wiper assembly relative to the resistor card based on a level of fuel in the fuel tank. The wiper assembly has another end with either single or multiple contact loops extending toward the resistor card and contacts on the contact loops to engage conductive inks on the resistor card. Examples of such fuel sensors are disclosed in U.S. Pat. No. 5,746,088 and U.S. Pat. No. 6,021,668.

Typically, the resistor card is manufactured by using a ceramic substrate, which is screened (printed) with conductive and resistive inks, which are subsequently fired at high temperatures in a kiln. Conductive inks used in the manufacturing of the ceramic card contain various metals and binders. Metals used in the conductive inks include Silver, Platinum, Palladium, Gold, Copper, as well as others. All conductive inks used in these fuel sensors contain Silver for its conductive properties and the ease with which electrical wires can be soldered to the substrate. Other metals such as Palladium are used to provide strength against shear forces exerted by the sliding contacts.

Ink strength is frequently expressed as a ratio of Silver to Palladium. Common ranges are in the 6:1 to 2:1 range. While Silver has many desirable properties as a conductor, it is a metal that is chemically very reactive to compounds frequently found in fuels. Sulfur is but one of these substances. When chemically attacked, the silver forms various compounds such as Silver Sulfide (AgS), which are non conductive. These deposits of nonconductive material generate contact resistance and create shifts and/or spikes in the output signal of a rheostat or potentiometer. This contact resistance can also appear as signal "noise" in the output of the ceramic resistor card. Signal "noise" are readings where the output "spikes" momentarily from what the output should be. Either condition may result in inaccurate fuel level indications, which are undesired.

The firing process (kiln) used to bond the inks to the substrate of the ceramic resistor card creates Oxides of the various metals on the surface of the conductive ink. These Oxides protect the ink from chemical attack by compounds such as the sulfur, since the metals have already "reacted" with the Oxygen. However, the back and forth movement of the contacts on the wiper assembly across the conductive ink creates mechanical abrasion of the contacts and the conductive ink surface referred to as "burnishing". Once the Oxide layer has been rubbed through, the Silver is open to attack by Sulfur and other reactive components found in hydrocarbon fuels.

Recently, it has been proposed to have a ceramic resistor card including conductive inks utilizing Gold (Au), Platinum (Pt), or a combination of the two (2) metals. The shear strength of Gold (Au) is so low as to allow smearing and trenching of the circuit segments due to the interaction of the sliding contacts. Gold (Au) also has a tendency to adhere to contact and then redeposit in a different location.

Platinum (Pt) is an excellent catalyst. As Benzene elements in the fuel are placed in shear by the sliding action of the contacts in the presence of Platinum (Pt), there is a tendency to "rip" atoms out of the Benzene ring. The resulting substance is lacquer. When lacquer (an organic nonconductor) builds up on the contact surfaces, the resulting contact resistance has the same effect as the Silver sulfide compounds.

While a combination of Gold (Au) and Platinum (Pt) creates a harder (stronger) wear surface, it is desirable to provide better durability to the ceramic resistor card. It is desirable to provide a ceramic resistor card assembly for a fuel sensor that is void of Silver or has a very low content of Silver in the conductive ink. It is also desirable to provide ceramic resistor card assembly for a fuel sensor that incorporates inks that are more resistant to chemical attack than those inks commonly used. It is further desirable to provide a ceramic resistor card assembly for a fuel sensor that is impervious to attack by sulfur compounds.

SUMMARY OF THE INVENTION

It is, therefore, one object of the present invention to provide a new ceramic resistor card assembly for a fuel sensor for a fuel tank.

It is another object of the present invention to provide a ceramic resistor card assembly for a fuel sensor incorporating a conductive ink that results in a harder and more chemically resistant wear surface.

To achieve the foregoing objects, the present invention is a ceramic resistor card assembly for a fuel sensor including a card portion made of a ceramic material. The ceramic resistor card assembly also includes a first conductive ink disposed on the card portion to form a fuel level portion. The ceramic resistor card assembly further includes a second conductive ink disposed on the card portion to form at least one contact for the fuel level portion. The first conductive ink is void of Silver and the second conductive ink contains Silver.

One advantage of the present invention is that a ceramic resistor card assembly is provided for a fuel sensor in a fuel tank of a vehicle. Another advantage of the present invention is that the ceramic resistor card assembly has a conductive ink path either void of silver or a very low content of silver. Yet another advantage of the present invention is that the ceramic resistor card assembly is impervious to attack by sulfur, chlorine, or other chemically active compounds. Still another advantage of the present invention is that the ceramic resistor card assembly provides a surface on which the existing wiper contacts ride, which contains no silver, improving performance. Yet a further advantage of the present invention is that the ceramic resistor card assembly has Palladium (Pd) added to a conductive ink made of an alloy Gold (Au) and Platinum (Pt) in the contact area to provide a better chemically resistant wear surface. Still a further advantage of the present invention is that the ceramic resistor card assembly has a conductive ink made of an alloy of Palladium (Pd) and Gold (Au) and Platinum (Pt) in the contact area, providing a minimal cost impact.

Other objects, features, and advantages of the present invention will be readily appreciated, as the same becomes better understood, after reading the subsequent description taken in conjunction with the accompanying drawings.

DESCRIPTION OF THE PREFERRED EMBODIMENT

Figure 1:
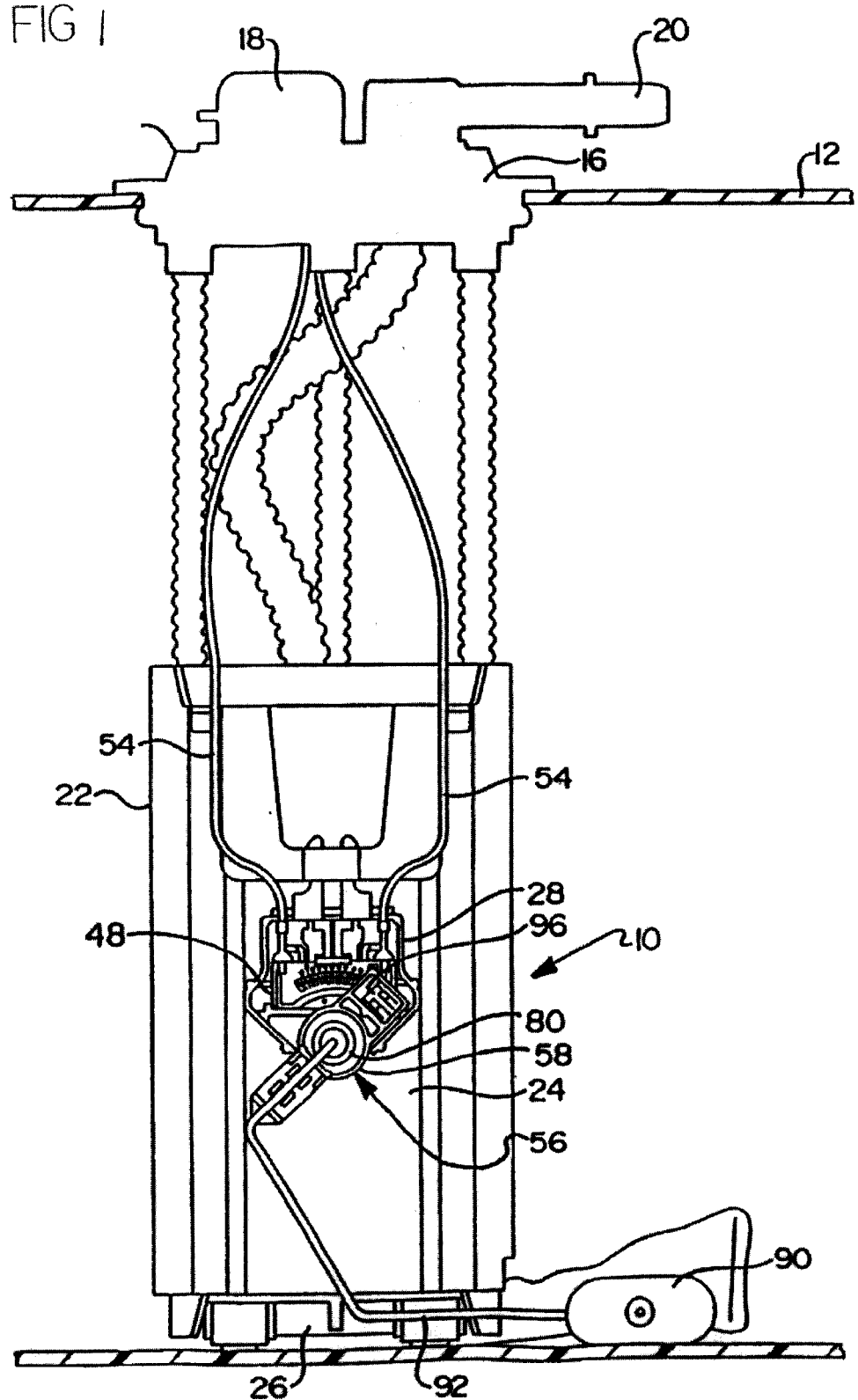
FIG. 1 is a fragmentary elevational view of a fuel sensor, according to the present invention, illustrated in operational relationship with a fuel tank for a vehicle.
Figure 2:
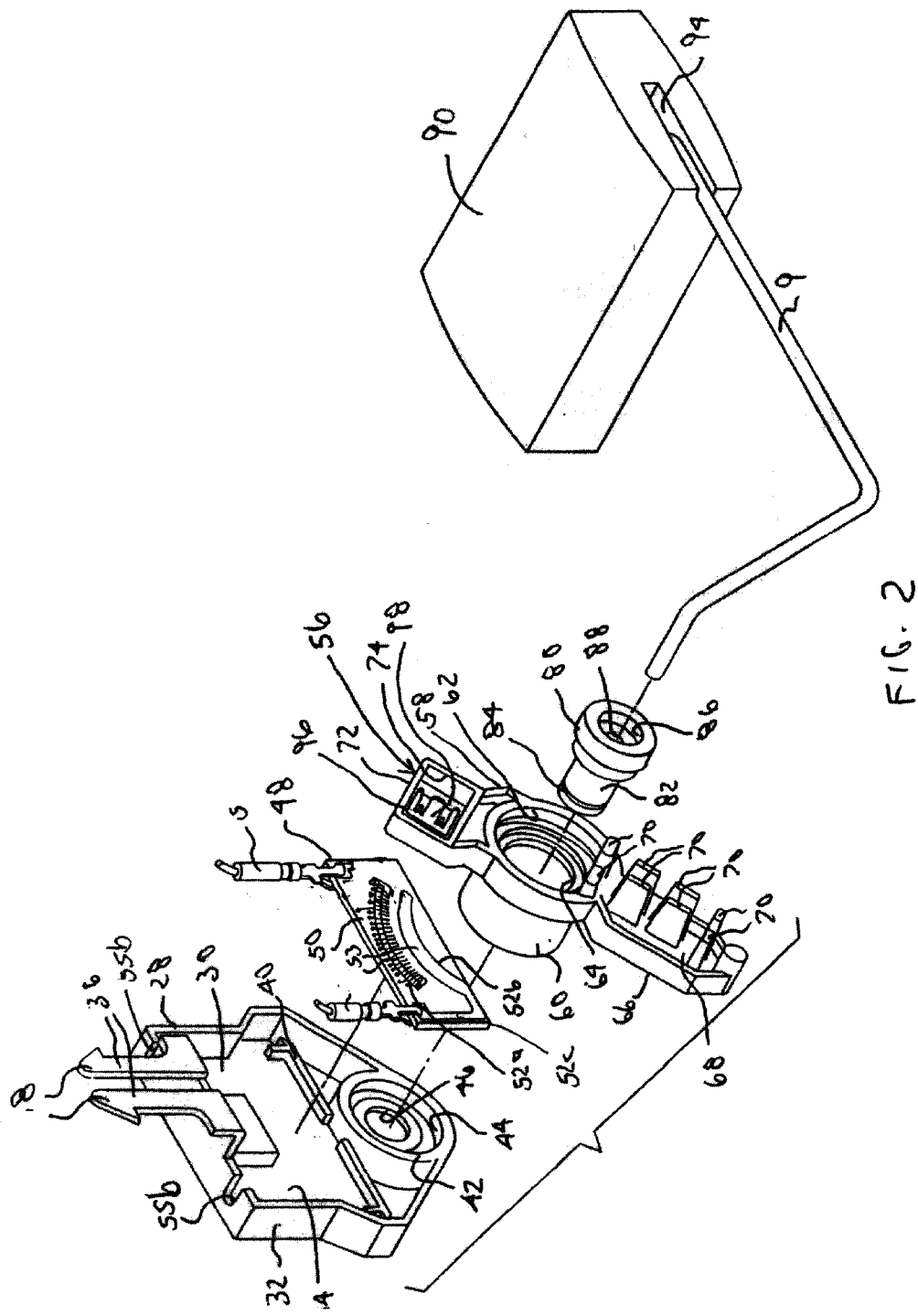
FIG. 2 is an exploded perspective view of the fuel sensor of FIG. 1.
Figure 3:
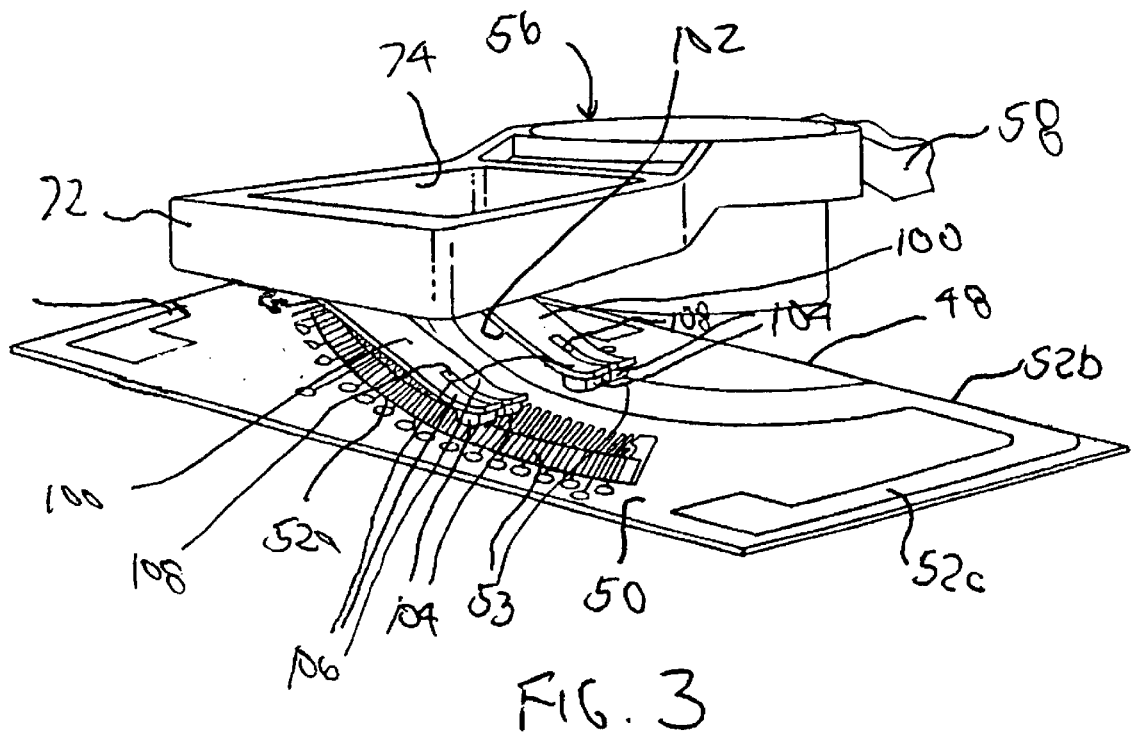
FIG. 3 is a perspective view of a wiper assembly and ceramic resistor card assembly, according to the present invention, of the fuel sensor of FIG. 1.

Referring to the drawings and in particular FIGS. 1 through 3, one embodiment of a fuel sensor 10, according to the present invention, is shown for a fuel tank 12 (partially shown) of a vehicle (not shown). The fuel tank 12 includes a fuel pump module 14 therein with a removable cover 16 sealed to the top of the fuel tank 12 with an electrical connector 18 and a fuel line outlet connector 20. The fuel tank 12 also includes a fuel reservoir 22 that contains an electrical fuel pump 24 with an inlet 26 and the fuel sensor 10 to indicate fuel level in the fuel tank 12. It should be appreciated that, except for the fuel sensor 10, the fuel tank 12 is conventional and known in the art.

Referring to FIGS. 1 through 3, the fuel sensor 10 includes a sensor housing 28 for connection to the fuel reservoir 22. The sensor housing 28 has a base wall 30 and a side wall 32 generally perpendicular to the base wall 30 to form a chamber 34. The sensor housing 28 also has a pair of arms 36 spaced laterally and extending longitudinally from the side wall 32. The arms 36 have a flange 38 extending laterally from a free end thereof. The arms 36 extend through apertures (not shown) in the fuel reservoir 22 and the flanges 38 prevent removal of the arms 36 from the apertures to suspend the sensor housing 28 from the fuel reservoir 22. It should be appreciated that the arms 36 and flanges 38 provide a snap-in feature for the sensor housing 28.

The sensor housing 28 also includes a support wall 40 extending laterally across the chamber 34 and generally perpendicular to the base wall 30 to support a variable resistor 48 to be described. The sensor housing 28 includes a cavity wall 42 extending generally perpendicular to the base wall 30 and connected to the side wall 32 to form a cavity 44. The cavity wall 42 is generally arcuate in shape to form a generally circular shape for the cavity 44. The sensor housing 28 also has an aperture 46 extending through the cavity 44. The sensor housing 28 is made of a plastic material and formed as a monolithic structure being integral, unitary and one-piece. It should be appreciated that the sensor housing 28 is conventional and known in the art.

Figure 4:
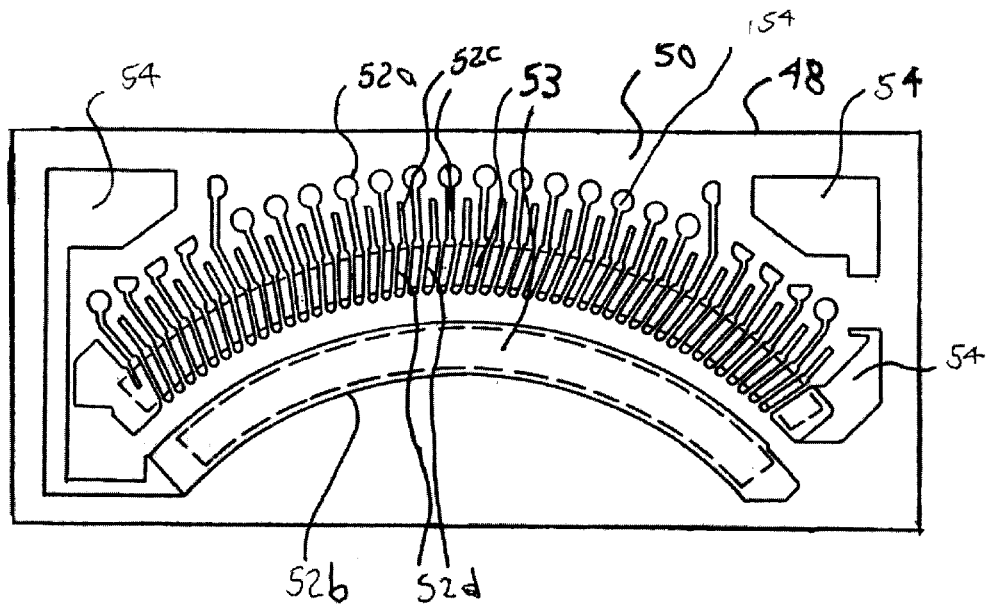
FIG. 4 is a plan view of the ceramic resistor card assembly of FIG. 3.

Referring to FIGS. 1 through 4, the fuel sensor 10 also includes a variable resistor comprising a ceramic resistor card assembly 48 operatively connected to the sensor housing 28. The ceramic resistor card assembly 48 has a card portion 50 and a resistive bus portion 52a and a conductive bus portion 52b spaced from the resistive bus portion 52a. The resistive bus portion 52a extends over a predetermined angle, for example approximately sixty-five degrees (65°), to provide a variable resistance corresponding to the fuel level in the fuel tank 12. The resistive bus portion 52a has a resistive path 52c and a conductive path 52d that is tied into the resistive path 52c at predetermined intervals. As illustrated in FIG. 4, the conductive bus portion 52b is solid, but may be segmented similar to the conductive path 52d of the resistive bus portion 52a. It should be appreciated that the conductive bus portion 52b is a common ground.

The card portion 50 is generally planar and rectangular in shape and made of a ceramic material. The portions 52a and 52b are made of a first conductive ink 53 where contacts to be describe ride on the card portion 50 are formed in generally arcuate pathways. The first conductive ink 53 is void of silver (Ag). The first conductive ink 53 is made of an alloy of Palladium (Pd) and Gold (Au) and Platinum (Pt). Preferably, the first conductive ink 53 has an approximate ratio of 56.4/6.3/10.4% by weight Gold (Au) to Palladium (Pd) to Platinum (Pt), balance being a binder. The first conductive ink 53 is of a type known as noble metal ink. The particle size of the first conductive ink 53 is approximately ten microns (10 $\mu$m). The first conductive ink 53 also contains a binder such as a glass frit. The first conductive ink 53 has a relatively small particle size to produce a smooth surface finish of approximately 0.50 Ra in the "As-Fired" state. One method of applying the first conductive ink 53 is to overlay an existing conductive ink (containing Silver), such as a second conductive ink 54 to be described, with the first conductive ink 53 in the area to be contacted by the contacts to be described. Preferably, the method of applying is to screen the contact surface area on the card portion 50 with the first conductive ink 53 and allow the first conductive ink 53 to make contact with the second conductive ink 54 as appropriate. It should be appreciated that the first conductive ink 53 has physical properties similar to that of conventional conductive inks being used such that the contact wear will remain constant.

The portions 52a and 52b that are made of a second conductive ink 54 on the card portion 50 are formed at the ends of the arcuate pathways. The second conductive ink 54 contains silver (Ag). The second conductive ink 54 is made of an alloy of silver (Ag) and palladium (Pd). The second conductive ink 54 is of a type known as "M" style ink. Preferably, the second conductive ink 54 has an approximate ratio of 2.3:1 Silver (Ag) to Palladium (Pd). The particle size of the second conductive ink 54 is approximately four micron (4 um). The second conductive ink 54 includes Silica and Zinc Oxide binders. It should be appreciated that where cost and solderability are not substantially required, the first conductive ink 53 may be used for the entire conductive portions of the portions 52a and 52b. It should also be appreciated that elimination of silver from the contact area of the card portion 50 will prevent the buildup of nonconductive (resistive) compounds, resulting from the chemical attack of sulfur due to exposure to hydrocarbon fuels and temperature. It should further be appreciated that by preventing buildup of these resistive films on the contact surfaces no change in calibration of the output signal or momentary "spikes" (noise) in the output signal will develop. It should still further be appreciated that either the entire area screened with conductive ink is screened with the first conductive ink 53, or the area on which the contacts ride is screened with the first conductive ink 53, while the remaining conductive ink surfaces are screened with the second conductive ink 54.

The ceramic resistor card assembly 48 is disposed in the chamber 34 of the sensor housing 28 and abuts the support wall 40. The ceramic resistor card assembly 48 is connected by suitable means such as wires 55a to the conductive portions 52a and 52b and the electrical connector 18. The wires 55a are press-fit into recesses 55b in the side wall 32 of the sensor housing 28 to support the ceramic resistor card assembly 48 in the chamber 34. It should be appreciated that the first conductive ink 53 of the ceramic resistor card assembly 48 improves robustness of the fuel sensor 10.

The fuel sensor 10 further includes a wiper assembly, generally indicated at 56, to cooperate with the ceramic resistor card assembly 48 to provide a signal as to a level of fuel in the fuel tank 12. The wiper assembly 56 includes a wiper housing 58 movable relative to the sensor housing 28. The wiper housing 58 has a base portion 60 with a generally cylindrical shape and a generally circular cross-section. The base portion 60 extends axially and has a cavity 62 in one end thereof. The base portion 60 also includes an aperture 64 extending axially therethrough and communicating with the cavity 62. The base portion 60 is disposed in the cavity 44 of the sensor housing 28 for rotation therein.

The wiper housing 58 also 42 includes a float arm portion 66 extending radially from the base portion 60. The float arm portion 66 has a base wall 68 and at least one, preferably a plurality of pairs of laterally spaced tabs 70 extending generally perpendicular to the base wall 68 for a function to be described.

The wiper housing 58 further includes a wiper portion 72 extending radially from the base portion 60 opposite the float arm portion 66. The wiper portion 72 is generally rectangular in shape and has a cavity 74 therein. The wiper portion 72 includes an aperture (not shown) extending therethrough to allow communication with the cavity 74 and form a seat (not shown) for a function to be described. The wiper housing 58 is formed from a plastic material. It should be appreciated that the wiper housing 58 is formed as a monolithic structure being integral, unitary and one-piece.

The wiper assembly 56 also includes a bushing 80 disposed in the cavity 62 of the base portion 60. The bushing 80 is generally cylindrical in shape and has a shaft 82 extending axially through the aperture 64 if the base portion 60. The shaft 82 has a diameter less than a diameter of a remainder of the bushing 80 and extends through the aperture 46 of the cavity 44 of the sensor housing 28. The shaft 82 has a groove 84 extending circumferentially about one end to receive a retainer (not shown) to prevent the shaft 82 from exiting the aperture 46 of the sensor housing 28. The bushing 80 has a cavity 86 in the end opposite the shaft 82 and an aperture 88 extending through the cavity 86 and shaft 82 for a function to be described. The bushing 80 is made of a plastic material and formed as a monolithic structure being integral, unitary and one-piece. It should be appreciated that the bushing 80 is conventional and known in the art.

The wiper assembly 56 includes a float 90 and a float arm 92 connected to the wiper housing 58. The float 90 is generally rectangular in shape and has a cavity 94 in one end. The float 90 is made of a floatable material having density less than density of the fuel. The float arm 92 is a rod that is bent with one end disposed in the cavity 94 of the float 90 and another end disposed in the aperture 88 of the bushing 80. The float arm 92 is also disposed between the tabs 70 of the float arm portion 66 of the wiper housing 58 and retained therein. The float arm 92 is made of a metal material. It should be appreciated that the float 90 and float arm 92 are conventional and known in the art.

Referring to FIG. 3, the wiper assembly 56 includes a wiper 96 for cooperating with the ceramic resistor card assembly 48. The wiper 96 has a base 98 that is generally rectangular in shape. The wiper 96 also has at least one, preferably a plurality of contact flex arms 100 formed by slots 102 spaced laterally and extending longitudinally in the base 98. The contact flex arms 100 extend longitudinally and downward at an angle from the base 98. The contact flex arms 100 and base 98 are formed from a non-Noble metal such as copper. The contact flex arms 100 and base 98 are integral, unitary and formed as one-piece. The base 98 is disposed in the cavity 74 of the wiper portion 72 of the wiper housing 58 adjacent the seat such that the contact flex arms 100 extend through the aperture toward the ceramic resistor card assembly 48. The wiper 96 is insert molded into the wiper portion 72 of the wiper housing 58 to retain the wiper 96 thereto. It should be appreciated that the contact flex arms 100 flex or deflect relative to the base 98.

The wiper 96 also includes at least one, preferably a plurality of or multiple contacts 104 near a free end of each contact flex arm 100. As illustrated in FIG. 3, each contact flex arm 100 has a plurality of contact portions 106 extending longitudinally by slots 108 spaced laterally and extending longitudinally in the free end thereof. The contacts 104 have a generally barrel shape formed by a wire extending laterally and secured to the contact flex arm 100 by suitable means such as welding. The barrel shape of the contact 104 provides an arcuate surface to contact the first conductive inks 53 of the ceramic resistor card assembly 48. The contact 104 is made of a Noble metal such as Paliney6 having a composition of 44% Pd, 38% Ag, 16% Cu, 1% Pt and 1% Ni by weight. It should be appreciated that the contact 104 provides high durability of a button contact while incorporating the characteristics of Noble metals.

In operation, the fuel sensor 10 is operatively connected to the fuel reservoir 22 of the fuel pump module 14 inside the fuel tank 12. Fuel inside the fuel tank 12 causes the float 90 to rise to the top thereof. The wiper 96 engages the conductive portions 52a and 52b of the variable resistor 48. The contacts 104 engage the first conductive ink 53 and the contact flex arms 104 create a shorting bar between resistive and conductive paths of the first conductive ink 53 on the ceramic resistor card assembly 48 to provide a predetermined resistance when an electrical signal is sent by a controller (not shown) via the electrical connector 18 to indicate the level of fuel in the fuel tank 12. As the fuel level increases or decreases in the fuel tank 12, the float 90 is raised or lowered to rotate the wiper housing 56 relative to the sensor housing 28 via the float arm 92. As the wiper housing 56 rotates, the wiper 96 rotates across the portions 52a and 52b and the contacts 104 move to different portions of the first conductive ink 53 to vary or provide a different predetermined resistance to indicate the level of fuel in the fuel tank 12. It should be appreciated that the wiper 96 has the ability to function in a five-volt (5 v), ten milliamp (10 mA) system. It should also be appreciated that the multiple contacts 104 insure that there is no break between the conductive and resistive paths.

Figure 5:
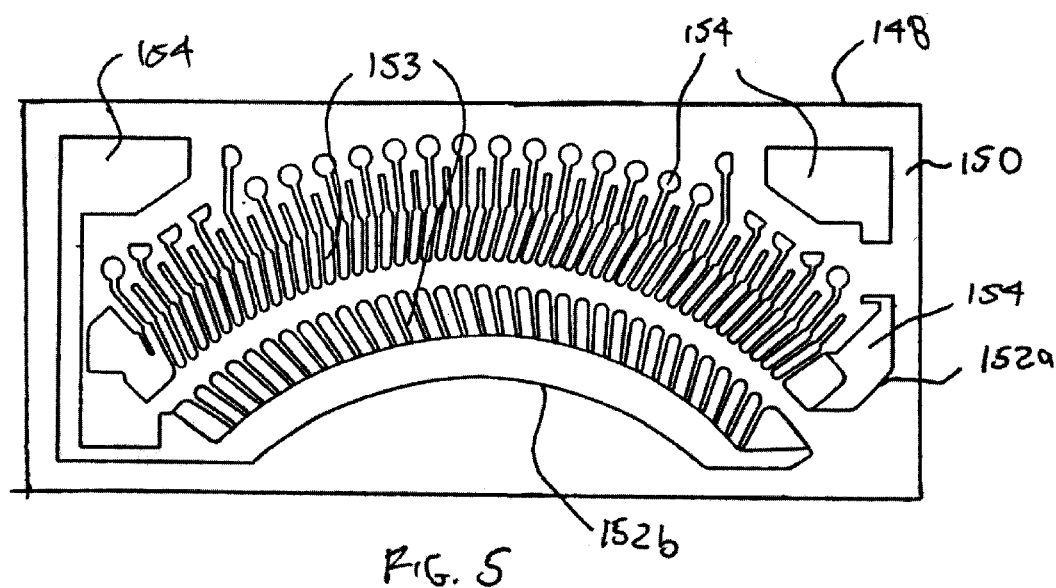
FIG. 5 is a plan view of another embodiment, according to the present invention, of the ceramic resistor card assembly of FIG. 3.

Referring to FIG. 5, another embodiment, according to the present invention, of the ceramic resistor card assembly 148 is shown. Like parts of the ceramic resistor card assembly 48 have like reference numerals increased by one hundred (100). In this embodiment, the conductive bus portion 152b is a segmented conductive bus. It should also be appreciated that the operation of the ceramic resistor card assembly 148 is similar to the ceramic resistor card assembly 48.

Accordingly, the ceramic resistor card assembly 48 removes Silver from the first conductive ink 53 used to form the path(s) on which the contacts 104 of the wiper assembly slide. By using the first conductive ink 53 consisting primarily of Palladium (Pd), Gold (Au), and Platinum (Pt) in the contact slide area, reactive compounds in the fuel will be unable to chemically attack the first conductive ink 53. By eliminating the buildup of nonconductive compounds, contact resistance output signal "noise" and "shift" are prevented.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

We claim:

1. A ceramic resistor card assembly for a fuel sensor comprising:
   a card portion made of a ceramic material;
   a first conductive ink disposed on said card portion;
   a second conductive ink disposed on said card portion; and
   said first conductive ink being void of silver and said second conductive ink containing silver, wherein said first conductive ink is overlayed onto said second conductive ink to form a fuel level portion on which said at least one contact member of said wiper assembly slides thereon and said second conductive ink forms at least one contact pad for said fuel level portion.

2. A ceramic resistor card assembly as set forth in claim 1 wherein said first conductive ink is an alloy of gold, platinum, and palladium.

3. A ceramic resistor card assembly as set forth in claim 1 wherein said second conductive ink is an alloy including silver and palladium.

4. A ceramic resistor card assembly for a fuel sensor comprising:
   a card portion made of a ceramic material;
   a first conductive ink disposed on said card portion to form a fuel level portion;
   a second conductive ink disposed on said card portion to form at least one contact for the fuel level portion;
   said first conductive ink being void of silver and said second conductive ink containing silver; and
   wherein said first conductive ink has a particle size of approximately ten microns.

5. A ceramic resistor card assembly for a fuel sensor comprising:
   a card portion made of a ceramic material;
   a first conductive ink disposed on said card portion to form a fuel level portion;
   a second conductive ink disposed on said card portion to form at least one contact for the fuel level portion;
   said first conductive ink being void of silver and said second conductive ink containing silver;
   wherein said first conductive ink is an alloy of gold, platinum, and palladium; and
   wherein a ratio of said gold to palladium to platinum is approximately 56.4/6.3/10.4.

6. A ceramic resistor card assembly as set forth in claim 2 wherein first conductive ink is disposed in at least one pathway on said card portion to form a resistive bus portion.

7. A ceramic resistor card assembly as set forth in claim 6 wherein said resistive bus portion comprises a resistive path and a conductive path connected at predetermined intervals to said resistive path.

8. A ceramic resistor card assembly as set forth in claim 6 wherein said at least one pathway is solid.

9. A ceramic resistor card assembly as set forth in claim 6 wherein said at least one pathway is segmented.

10. A fuel sensor comprising:
    a ceramic resistor card assembly;
    a wiper assembly for rotation relative to said ceramic resistor card assembly and having at least one contact member;
    said ceramic resistor card assembly having a ceramic card portion, a first conductive ink disposed on said ceramic card portion, and a second conductive ink disposed on said card portion; and
    said first conductive ink being void of silver and said second conductive ink containing silver, wherein said first conductive ink is overlayed onto said second conductive ink to form a fuel level portion on which said at least one contact member of said wiper assembly slides thereon and said second conductive ink forms at least one contact pad for said fuel level portion.

11. A fuel sensor as set forth in claim 10 wherein said first conductive ink is an alloy of gold, platinum, and palladium.

12. A fuel sensor as set forth in claim 10 wherein said second conductive ink is an alloy including silver and palladium.

13. A fuel sensor comprising:
    a ceramic resistor card assembly;
    a wiper assembly for rotation relative to said ceramic resistor card assembly;
    said ceramic resistor card assembly having a ceramic card portion, a first conductive ink disposed on said ceramic card portion to form a fuel level portion, and a second conductive ink disposed on said card portion to form at least one contact for the fuel level portion;
    said first conductive ink being void of silver and said second conductive ink containing silver; and
    wherein said first conductive ink has a particle size of approximately ten microns.

14. A fuel sensor comprising:
    a ceramic resistor card assembly;
    a wiper assembly for rotation relative to said ceramic resistor card assembly;
    said ceramic resistor card assembly having a ceramic card portion, a first conductive ink disposed on said ceramic card portion to form a fuel level portion, and a second conductive ink disposed on said card portion to form at least one contact for the fuel level portion;
    said first conductive ink being void of silver and said second conductive ink containing silver;
    wherein said first conductive ink is an alloy of gold, platinum, and palladium; and
    wherein a ratio of said gold to palladium to platinum is approximately 56.4/6.3/10.4.

15. A fuel sensor as set forth in claim 11 wherein first conductive ink is disposed in a first pathway on said card portion to form a resistive bus portion and in a second pathway spaced from said first pathway to form a conductive bus portion.

16. A fuel sensor as set forth in claim 15 wherein said resistive bus portion comprises a resistive path and a conductive path connected at predetermined intervals to said resistive path.

17. A fuel sensor as set forth in claim 15 wherein said conductive bus portion is solid.

18. A fuel sensor as set forth in claim 15 wherein said conductive bus portion is segmented.

19. A fuel sensor comprising:
- a sensor housing operatively connected to a fuel tank;
- a ceramic resistor card assembly operatively connected to said sensor housing, said ceramic resistor card assembly having a ceramic card portion, a first conductive ink disposed on said ceramic card portion, an a second conductive ink disposed on said card portion;
- a wiper assembly operatively connected to said sensor housing for rotation relative to said ceramic resistor card assembly and including a wiper with a plurality of contact members for contacting and sliding on said first conductive ink of said ceramic resistor card assembly as said wiper assembly rotates; and
- wherein said first conductive ink is void of silver and said second conductive ink contains silver, wherein said first conductive ink is overlayed onto said second conductive ink to form an arcuate fuel level pathway and said second conductive ink forms at least one contact pad at the end of said fuel level portion.

* * * * *